(12) United States Patent
Carmel-Veilleux et al.

(10) Patent No.: US 9,632,179 B2
(45) Date of Patent: Apr. 25, 2017

(54) ESTIMATING A BASELINE OF A PROXIMITY SENSOR

(75) Inventors: Tennessee Carmel-Veilleux, Kitchener (CA); Andrew Martin Garber, Waterloo (CA)

(73) Assignee: BlackBerry Limited, Waterloo, Ontario (CA)

( * ) Notice: Subject to any disclaimer, the term of this patent is extended or adjusted under 35 U.S.C. 154(b) by 640 days.

(21) Appl. No.: 13/541,721

(22) Filed: Jul. 4, 2012

(65) Prior Publication Data

US 2014/0012528 A1    Jan. 9, 2014

(51) Int. Cl.
| | |
|---|---|
| *G06F 19/00* | (2011.01) |
| *G01B 11/14* | (2006.01) |
| *G01S 17/08* | (2006.01) |
| *G06F 3/044* | (2006.01) |
| *H03K 17/945* | (2006.01) |

(52) U.S. Cl.
CPC .............. *G01S 17/08* (2013.01); *G06F 3/044* (2013.01); *H03K 17/945* (2013.01); *H03K 2217/94026* (2013.01); *H04M 2250/22* (2013.01)

(58) Field of Classification Search
CPC .......... G06F 17/18; G06F 17/00; G06F 3/044; G06F 3/041; G06F 3/0416; G06Q 10/04; G05B 23/0254; G01S 17/08; H03K 17/945; H03K 2217/94026; H04M 2250/22
USPC .................................. 702/181, 189, 183, 127
See application file for complete search history.

(56) References Cited

U.S. PATENT DOCUMENTS

| | | | |
|---|---|---|---|
| 6,661,239 B1 * | 12/2003 | Ozick | G01D 5/2405 |
| | | | 324/658 |
| 7,302,280 B2 | 11/2007 | Hinckley et al. | |
| 7,633,076 B2 | 12/2009 | Huppi et al. | |
| 7,702,282 B2 | 4/2010 | Sandegard et al. | |
| 7,884,733 B2 * | 2/2011 | O'Dowd et al. | 340/686.1 |
| 8,026,904 B2 | 9/2011 | Westerman | |
| 8,040,142 B1 | 10/2011 | Bokma et al. | |
| 8,170,621 B1 | 5/2012 | Lockwood | |
| 8,542,202 B2 * | 9/2013 | Zhuang | G06F 3/044 |
| | | | 345/173 |
| 2006/0103637 A1 | 5/2006 | Yamaguchi et al. | |
| 2006/0166702 A1 | 7/2006 | Dietz et al. | |
| 2007/0032967 A1 | 2/2007 | Feen | |
| 2008/0006762 A1 * | 1/2008 | Fadell | G01J 1/4204 |
| | | | 250/201.1 |

(Continued)

OTHER PUBLICATIONS

Intersil, Proximity Sensors, Mar. 26 2009, Intersil, AN1436.0.*

(Continued)

*Primary Examiner* — John Breene
*Assistant Examiner* — Mohammad Islam
(74) *Attorney, Agent, or Firm* — Rowand LLP (57) ABSTRACT

Described are methods and systems for estimating a baseline of a proximity sensor on an electronic device comprising: collecting proximity sensor data at the electronic device using the proximity sensor; collecting second data using a second source at the electronic device; obtaining a sample of the proximity sensor data at the electronic device when it is determined that no object is proximal to a first face of the electronic device based on the proximity sensor data and based on the second data; and approximating the baseline of the proximity sensor using the obtained sample.

19 Claims, 6 Drawing Sheets

(56) References Cited

U.S. PATENT DOCUMENTS

| | | |
|---|---|---|
| 2008/0158174 A1* | 7/2008 | Land ..................... G06F 3/0418 345/173 |
| 2008/0158182 A1 | 7/2008 | Westerman |
| 2009/0251439 A1 | 10/2009 | Westerman et al. |
| 2009/0262078 A1 | 10/2009 | Pizzi |
| 2010/0321321 A1 | 12/2010 | Shenfield et al. |
| 2011/0019205 A1* | 1/2011 | Gerber ............... G06K 9/00355 356/615 |
| 2011/0130958 A1 | 6/2011 | Stahl |
| 2011/0201381 A1* | 8/2011 | Herz et al. ................. 455/550.1 |
| 2011/0223978 A1 | 9/2011 | Chu |
| 2011/0312349 A1* | 12/2011 | Forutanpour ......... G06F 1/1626 455/466 |
| 2012/0153153 A1* | 6/2012 | Chang ..................... G01C 3/08 250/338.1 |
| 2012/0287031 A1* | 11/2012 | Valko ..................... G09G 5/00 345/156 |
| 2012/0306770 A1* | 12/2012 | Moore ..................... G06F 3/01 345/173 |

OTHER PUBLICATIONS

Intersil, Proximity Sensors, Mar. 26, 2009, Intersil, AN1436.0,1-10.*
CIPO, CA Office Action relating to Application No. 2,820,608, dated Feb. 3, 2015.
EPO, EP Office Action relating to Application No. 12175024.4, dated Nov. 25, 2014.
Extended European Search Report dated Jan. 23, 2013, Application No. 12175024.4.
Cravotta, Robert; Hidden Interfaces a New Playground for Embedded Innovations, Embedded Insights Inc., www.edn.com, Mar. 15, 2012.
O'Connor, Todd; Microchip Technology Inc., mTouchTM Projected Capacitive Touch Screen Sensing Theory of Operation, 2010, USA, ISBN: 978-1-60932-466-7.

* cited by examiner

ESTIMATING A BASELINE OF A PROXIMITY SENSOR

FIELD

The present matter relates to electronic devices and in particular to systems and methods for estimating the signal baseline of a proximity sensor associated with an electronic device.

BACKGROUND

Electronic devices are commonly used to receive data through various input interfaces or input devices such as microphones, touchscreen displays, keyboards, trackballs, etc. Proximity sensors on electronic devices can gather proximity data to use as a parameter in a determination of the type of input interface or input device to employ to receive data. Proximity sensors commonly have an at-rest, no-object-present level (a "baseline") which is used to analyze the gathered proximity data.

BRIEF DESCRIPTION OF DRAWINGS

In order that the subject matter may be readily understood, embodiments are illustrated by way of examples in the accompanying drawings, in which.

DETAILED DESCRIPTION

In accordance with an aspect, the present disclosure describes a method of estimating a baseline of a proximity sensor on an electronic device, the method comprising collecting proximity sensor data at the electronic device using the proximity sensor; determining that no object is proximal to a first face of the electronic device based on the proximity sensor data; collecting second data using a second source at the electronic device; determining that no object is proximal to the first face of the electronic device based on the second data; obtaining a sample of the proximity sensor data at the electronic device when it is determined that no object is proximal to the first face of the electronic device based on the proximity sensor data and based on the second data; and approximating the baseline of the proximity sensor using the obtained sample.

In accordance with another aspect, the present disclosure describes an electronic communication device comprising: a memory; a proximity sensor coupled to the memory for collecting proximity sensor data; a second source coupled to the memory for collecting second data; a processor coupled to the memory to execute instructions to configure the processor to: collect proximity sensor data at the electronic device using the proximity sensor; determine that no object is proximal to a first face of the electronic device based on the proximity sensor data; collect second data using a second source at the electronic device; determine that no object is proximal to the first face of the electronic device based on the second data; obtain a sample of the proximity sensor data at the electronic device when it is determined that no object is proximal to the first face of the electronic device based on the proximity sensor data and based on the second data; and approximate the baseline of the proximity sensor using the obtained sample.

In accordance with another aspect, the present disclosure describes a computer readable storage medium comprising computer-executable instructions which, when executed, cause a processor to: collect proximity sensor data at the electronic device using a proximity sensor; determine that no object is proximal to a first face of the electronic device based on the proximity sensor data; collect second data using a second source at the electronic device; determine that no object is proximal to the first face of the electronic device based on the second data; obtain a sample of the proximity sensor data at the electronic device when it is determined that no object is proximal to the first face of the electronic device based on the proximity sensor data and based on the second data; and approximate the baseline of the proximity sensor using the obtained sample.

Example Network Infrastructure 100

Figure 1:
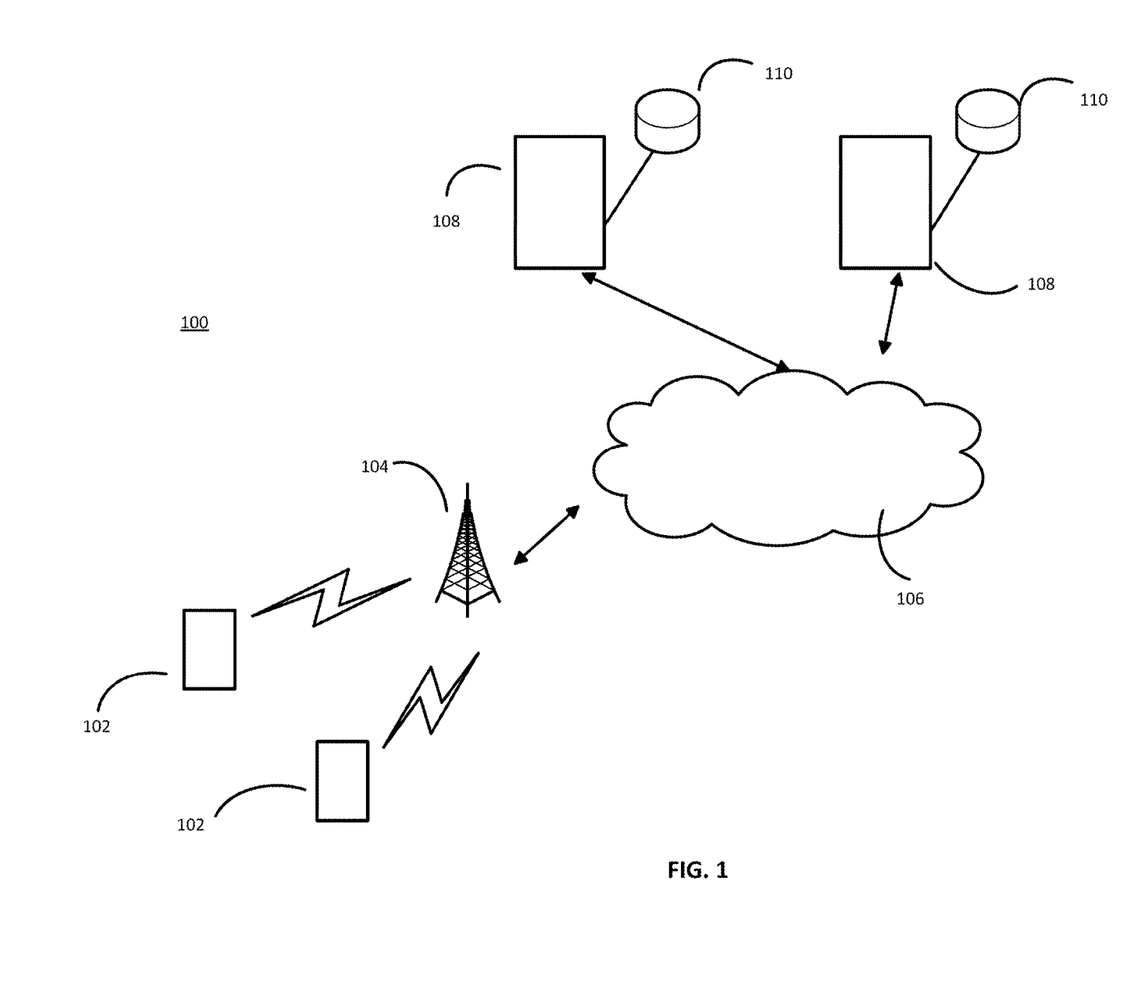
FIG. 1 is a block diagram illustrating the components of a network infrastructure.

For convenience, like numerals in the description refer to like structures in the drawings. Referring to FIG. 1, a typical telecommunication infrastructure is illustrated generally by numeral 100. The telecommunication infrastructure 100 includes one or more electronic devices 102, one or more base stations 104, a communication network 106, a plurality of network servers 108 and a plurality of databases 110.

The electronic devices 102 include wireless computing devices such as smart phones, personal digital assistants (PDAs), tablet computers, and the like. The electronic devices 102 are in communication with one of the base stations 104. The base stations 104 relay data between the electronic devices 102 and the network servers 108 via the communication network 106. Accordingly, the communication network 106 can include several components such as a wireless network, a relay, a corporate server and/or a mobile data server for relaying data between the base stations 104 and the network servers 108. The network servers 108 can be in communication with one or more databases 110 on which data can be stored. The network servers 108 can also include servers such as a Web server, an application server 108, and an application server with web services.

It will be appreciated by a person of ordinary skill in the art that the telecommunication infrastructure 100 described herein is exemplary and that changes may be made to one or more components to accommodate different network configurations without affecting the scope of the aspects described herein.

Example Electronic Device 102

Figure 2:
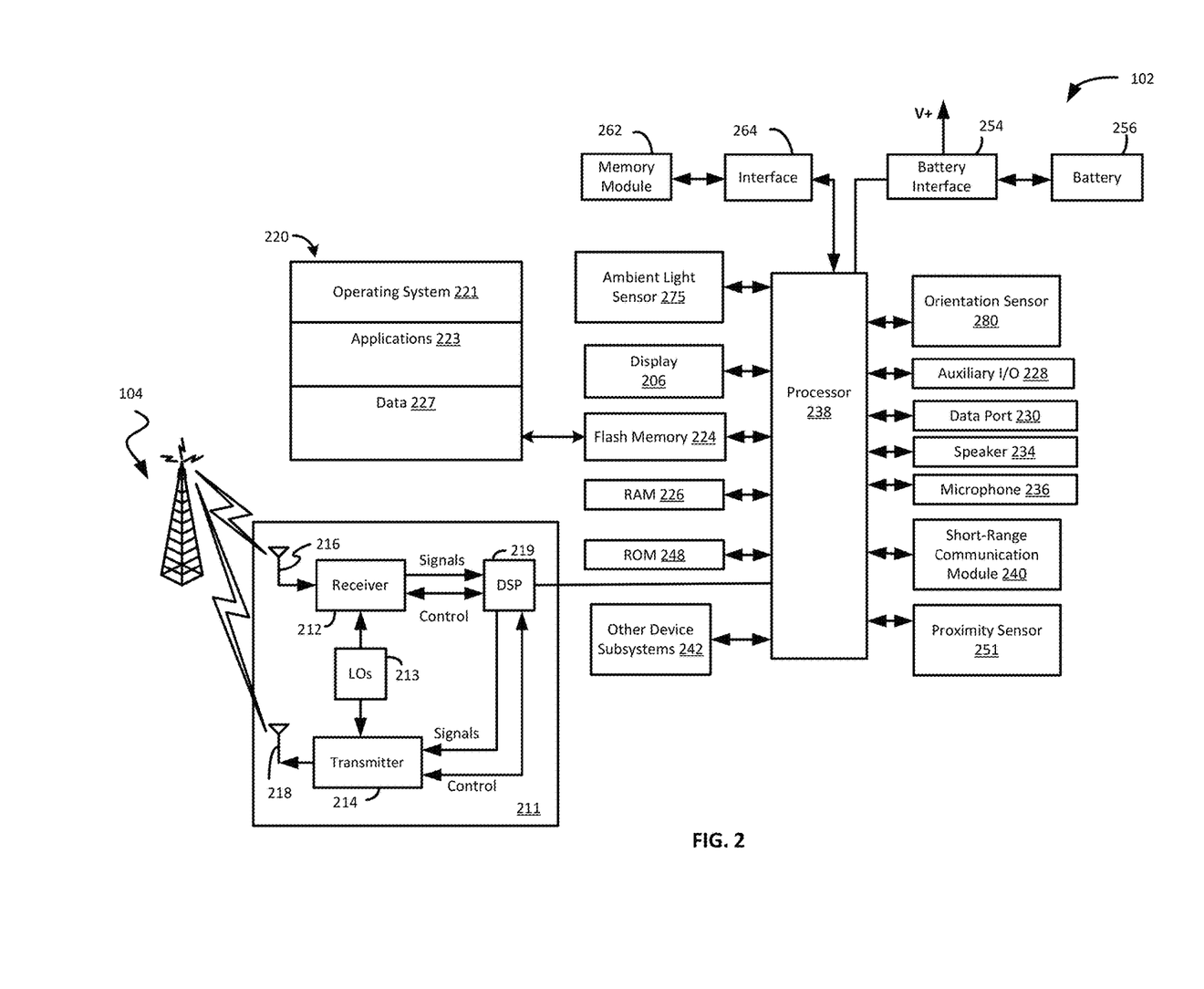
FIG. 2 is a block diagram illustrating components of an electronic device.

Referring to FIG. 2, an example electronic device 102 is illustrated in greater detail. The electronic device 102 can be a two-way electronic device having both voice and data communication capabilities, including the capability to communicate with other computer systems. Depending on the functionality provided by the electronic device 102, it may be referred to as a data messaging device, a two-way pager, a cellular telephone with data messaging capabilities, a wireless Internet appliance, a smartphone, a tablet computer, or a communication device, for example.

The electronic device 102 includes a processor 238, which controls general operation of the electronic device 102. The processor 238 can interact with additional device subsystems such as a display 206, a flash memory 224, a random access memory (RAM) 226, a read only memory (ROM) 248, auxiliary input/output (I/O) subsystems 228 (such as a keyboard or trackball, for example), a data port 230, a speaker 234, a microphone 236, a short-range communication module 240 such as Bluetooth® for example, a proximity sensor 251, an orientation sensor 280, an ambient light sensor 275 and any other device subsystems or peripheral devices generally designated at 242. The processor 238 interacts with other device subsystems such as a wireless communication subsystem 211 for exchanging radio frequency signals with a base station 104 and/or a communication network 106 (not shown in FIG. 2) to perform communication functions. Some of the subsystems shown in FIG. 2 perform communication-related functions, whereas other subsystems may provide "resident" on-device functions.

The electronic device 102 includes a communication subsystem 211, which includes a receiver 212, a transmitter 214, and associated components, such as one or more embedded or internal antenna elements 216 and 218, local oscillators (LOs) 213, and a processing module such as a digital signal processor (DSP) 219. As will be apparent to those skilled in field of communications, the particular design of the communication subsystem 211 depends on the communication network 106 in which the electronic device 102 is intended to operate.

Operating system software used by the processor 238 may be stored in a persistent store such as the flash memory 224 (which may be a ROM), a ROM 248 or similar storage element (not shown). The operating system 221, specific device applications, or parts thereof, may be temporarily loaded into a volatile store such as RAM 226.

The processor 238, in addition to its operating system functions, enables execution of software applications on the electronic device 102. A predetermined set of applications, which control basic device operations, is installed on the electronic device 102 during its manufacture. These basic operations typically include data and voice communication applications, for example. Additionally, applications may also be loaded onto the electronic device 102 through the network, an auxiliary I/O subsystem 228, data port 230, short-range communication module 240, or any other suitable subsystem 242, and installed by a user in RAM 226, ROM 248 or flash memory 224, for execution by the processor 238. Such flexibility in application installation increases the functionality of the electronic device 102 and may provide enhanced on-device features, communication-related features, or both.

The short range communication module 240 provides for communication between the electronic device 102 and different systems or devices, which need not be similar devices. For example, the short range communication module 240 may include an infrared device and associated circuits and components, or a wireless bus protocol compliant communication mechanism such as a Bluetooth® communication module to provide for communication with similarly-enabled systems and devices.

The proximity sensor 251 can include an infrared light source, a sensor that receives infrared light and associated circuits and components. The proximity sensor 251 is associated with the processor 238 so that the processor can evaluate the received or measured infrared light. Infrared light can be emitted from the infrared light source and can then reflected off of objects proximal to the proximity sensor 251 and the intensity of the reflected infrared light can then be received by the sensor. It is understood that there may be objects external to the device that reflect the emitted infrared light. In one or more embodiments, emitted infrared light causes some amount of reflection off of internal components of the electronic device 102 regardless of whether there are external objects proximal to the proximity sensor 251. Thus in one or more embodiments, the proximity sensor 251 will always measure some amount of light intensity or extraneous signal. The amount of light intensity (or other measurement) that the proximity sensor 251 measures when no object external to the electronic device 102 is proximal to the proximity sensor 251 can be called the "baseline" measurement. The baseline may also include a level of noise measurement, electrical biases and/or the measurement of light that scattered through optical systems associated with the electronic device 102 and reflected back. In an exemplary embodiment, the proximity sensor 251 takes into account the baseline measurement when evaluating infrared light sensor readings in order to determine or estimate that an (external) object is proximal to the proximity sensor 251 and thus proximal to the first face 302 (FIG. 3) of the electronic device 102.

The proximity sensor 251 may also be associated with a timer for measuring the time between emitting the infrared light and receiving a reflection of the infrared light. For example, the time between emitting the infrared light and receiving the reflection can be used to estimate the proximity of an object to the electronic device 102.

The orientation sensor 280 can include a gyroscope and/or accelerometer associated with the electronic device 102. The orientation sensor 280 can measure the orientation of the electronic device 102 relative to the ground. In one or more embodiments, the orientation sensor 280 measures the acceleration and the angle of the electronic device 102 relative to the ground. The measurements taken by the orientation sensor 280 can be stored in memory 224. The orientation sensor 280 can operate in response to instructions from the processor 238 and/or from instructions through an input interface. It is understood that there can be more than one orientation sensor 280 associated with the electronic device 102.

The display 206 is used to visually present an application's graphical user interface (GUI) to the user. The user can manipulate application data by modifying information on the GUI using an auxiliary input/output device, such as a keyboard for example. Depending on the type of electronic device 102, the user may have access to other types of input devices, such as, for example, a scroll wheel, trackball, light pen or touch-sensitive screen.

The electronic device 102 may include a touchscreen display in some example embodiments. The touchscreen display may be constructed using a touch-sensitive input surface connected to an electronic controller. The touch-sensitive input surface overlays the display and may be referred to as a touch-sensitive overlay. The touch-sensitive overlay and the electronic controller provide a touch-sensitive input interface and the processor 238 interacts with the touch-sensitive overlay via the electronic controller. That is, the touchscreen display acts as both an input interface and an output interface.

In some example embodiments, the auxiliary input/output (I/O) subsystems 228 may include an external communication link or interface, for example, an Ethernet connection. The electronic device 102 may include other wireless communication interfaces for communicating with other types of wireless networks; for example, a wireless network such as an orthogonal frequency division multiplexed (OFDM) network.

In some example embodiments, the electronic device 102 also includes a removable memory module 262 (typically including flash memory) and a memory module interface 264. Network access may be associated with a subscriber or user of the electronic device 102 via the memory module 262, which may be a Subscriber Identity Module (SIM) card for use in a GSM network or other type of memory module for use in the relevant wireless network type. The memory module 262 may be inserted in or connected to the memory module interface 264 of the electronic device 102.

The electronic device 102 may store data 227 in an erasable persistent memory, which in one example embodiment is the flash memory 224. In various example embodiments, the data 227 may include service data having information used by the electronic device 102 to establish and maintain communication with the communication network 106. The data 227 may also include user application data such as email messages, address book and contact information, calendar and schedule information, notepad documents, images, and other commonly stored user information stored on the electronic device 102 by its user, and other data.

In some example embodiments, the electronic device 102 is provided with a service routing application programming interface (API) which provides an application with the ability to route traffic through a serial data (e.g., USB) or Bluetooth® (Bluetooth® is a registered trademark of Bluetooth SIG, Inc.) connection to the host computer system using standard connectivity protocols. When a user connects their electronic device 102 to the host computer system via a USB cable or Bluetooth® connection, traffic that was destined for the communication network 106 is automatically routed to the electronic device 102 using the USB cable or Bluetooth® connection. Similarly, any traffic destined for the communication network 106 is automatically sent over the USB cable Bluetooth® connection to the host computer for processing.

The electronic device 102 also includes or is connected to a power source such as a battery 256, which may be one or more rechargeable batteries that may be charged, for example, through charging circuitry coupled to a battery interface 254 such as the serial data port 230. The battery 256 provides electrical power to at least some of the electrical circuitry in the electronic device 102, and the battery interface 254 provides a mechanical and electrical connection for the battery 256. The battery interface 254 is coupled to a regulator (not shown) which provides power V+ to the circuitry of the electronic device 102.

A predetermined set of applications that control basic device operations, including data and possibly voice communication applications may be installed on the electronic device 102 during or after manufacture. Additional applications and/or upgrades to an operating system 221 or software applications 223 may also be loaded onto the electronic device 102 through the communication network 106, the auxiliary I/O subsystem 228, the data port 230, the short range communication module 240, or other suitable device subsystems 242. The downloaded programs or code modules may be permanently installed; for example, written into the program memory (e.g. the flash memory 224), or written into and executed from the RAM 226 for execution by the processor 238 at runtime.

In some example embodiments, the electronic device 102 may provide two principal modes of communication: a data communication mode and a voice communication mode. In the data communication mode, a received data signal such as a text message, an email message, or webpage download will be processed by the communication subsystem 211 and input to the processor 238 for further processing. For example, a downloaded webpage may be further processed by a web browser or an email message may be processed by the email messaging application and output to the display 206. A user of the electronic device 102 may also compose data items, such as email messages; for example, using an input interface in conjunction with the display 206. These composed items may be transmitted through the communication subsystem 211 over the communication network 106.

In the voice communication mode, the electronic device 102 provides telephony functions and may operate as a typical cellular phone. The overall operation is similar to the data communication mode, except that the received signals would be output to the speaker 234 and signals for transmission would be generated by a transducer such as the microphone 236. The telephony functions are provided by a combination of software/firmware (i.e., a voice communication module) and hardware (i.e., the microphone 236, the speaker 234 and input devices). Alternative voice or audio I/O subsystems, such as a voice message recording subsystem, may also be implemented on the electronic device 102. Although voice or audio signal output may be accomplished primarily through the speaker 234, the display 206 may also be used to provide an indication of the identity of a calling party, duration of a voice call, or other voice call related information.

The processor 238 operates under stored program control and executes software modules 220, such as applications 223, stored in memory such as persistent memory; for example, in the flash memory 224. As illustrated in FIG. 2, the software modules 220 may include operating system software and one or more additional applications 223 or modules. The processor 238 may also operate to process data 227 stored in memory associated with the electronic device 102.

Exemplary Electronic Device 102 with Proximity Sensor 251

Figure 3:
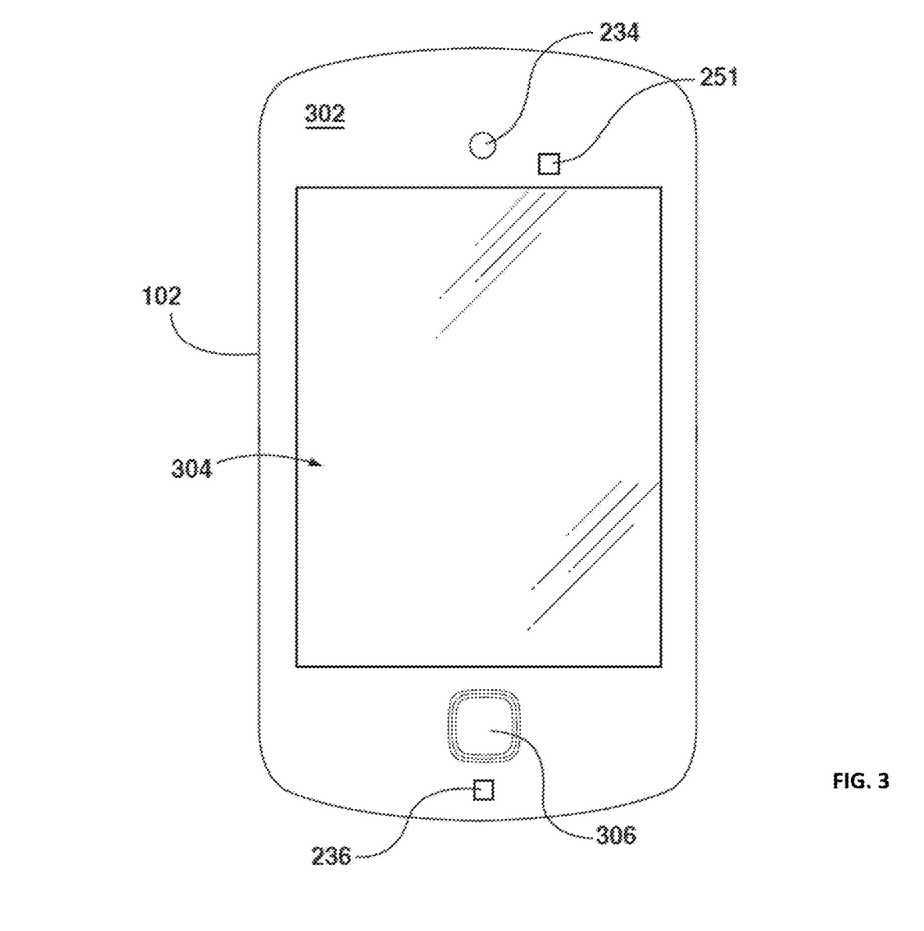
FIG. 3 is a top view of an electronic device.

An exemplary electronic device 102 with a proximity sensor 251 is shown in FIG. 3. The electronic device 102 has a first face 302 with a touchscreen display 304, an activation button 306, a microphone 236, a speaker 234 and a proximity sensor 251. It is recognized that other components that are not shown can be associated with or attached to the electronic device 102. The touchscreen display 304 can be the display 206 illustrated in FIG. 2 coupled with a touch-sensitive overlay.

The microphone 236 is configured to receive audio input and the speaker 234 is configured to output audio signals. Each of the microphone 236 and speaker 234 are associated with the processor 238 such that the audio input to the microphone 236 can be transmitted across a communication network 106 to a second electronic device and such that audio signals received from the second electronic device can be output from or at the speaker 234.

When the electronic device 102 is connected to the second electronic device to transmit and receive audio signals (e.g. during a phone conversion) the electronic device 102 can be adjacent to a person's head so that the speaker 234 is proximal to the ear and so that the microphone 236 is proximal to the mouth. When the electronic device 102 is adjacent to a person's head, the risk of accidental input on the touchscreen display 304 (or other input interface) can be increased. For example, during a phone conversation the person's face may touch the touchscreen display causing unwanted or accidental input.

In accordance with an exemplary embodiment, the electronic device 102 can be stored in a bag or pocket or other enclosed area. When being stored, the touchscreen display 304 risks receiving accidental or unwanted input. For example, the inside of the bag, or other objects contained in the bag can touch the touchscreen display 304 causing the accidental or unwanted input.

To help avoid the accidental input on the touchscreen display 304 (or other tactile input interface such as a keyboard) of the electronic device 102, the touchscreen display 304 can be temporarily shut off or temporarily deactivated. When temporarily shut off, the touchscreen display 304 (or other tactile input interface) does not process or read touch input. For example, when the touchscreen display 304 is temporarily shut off a touch on the touchscreen display 304 is not processed and thus does not cause any action or processing at the electronic device 102. In accordance with an embodiment, the touchscreen display 304 is shut off in circumstances when accidental input is likely and when the touchscreen display 304 is not otherwise in use. For example, the touchscreen display 304 can be shut off or deactivated for the duration of time that accidental input is likely to occur such as when an object is proximal the first face 302 of the electronic device 102.

In accordance with one or more embodiments, the proximity sensor 251 can be used to detect whether an object is proximal to the first face 302 of the electronic device 102 on which the touchscreen display 304 resides. In accordance with the illustrated embodiment, the proximity sensor 251 is facing the same direction as the first face 302 so that the proximity sensor 251 detects or measures the proximity of objects to the first face 302. For example, the proximity sensor 251 can gather data regarding the proximity of nearby objects and this data can be used to estimate the distance that an object is from the first face 302.

Figure 4:
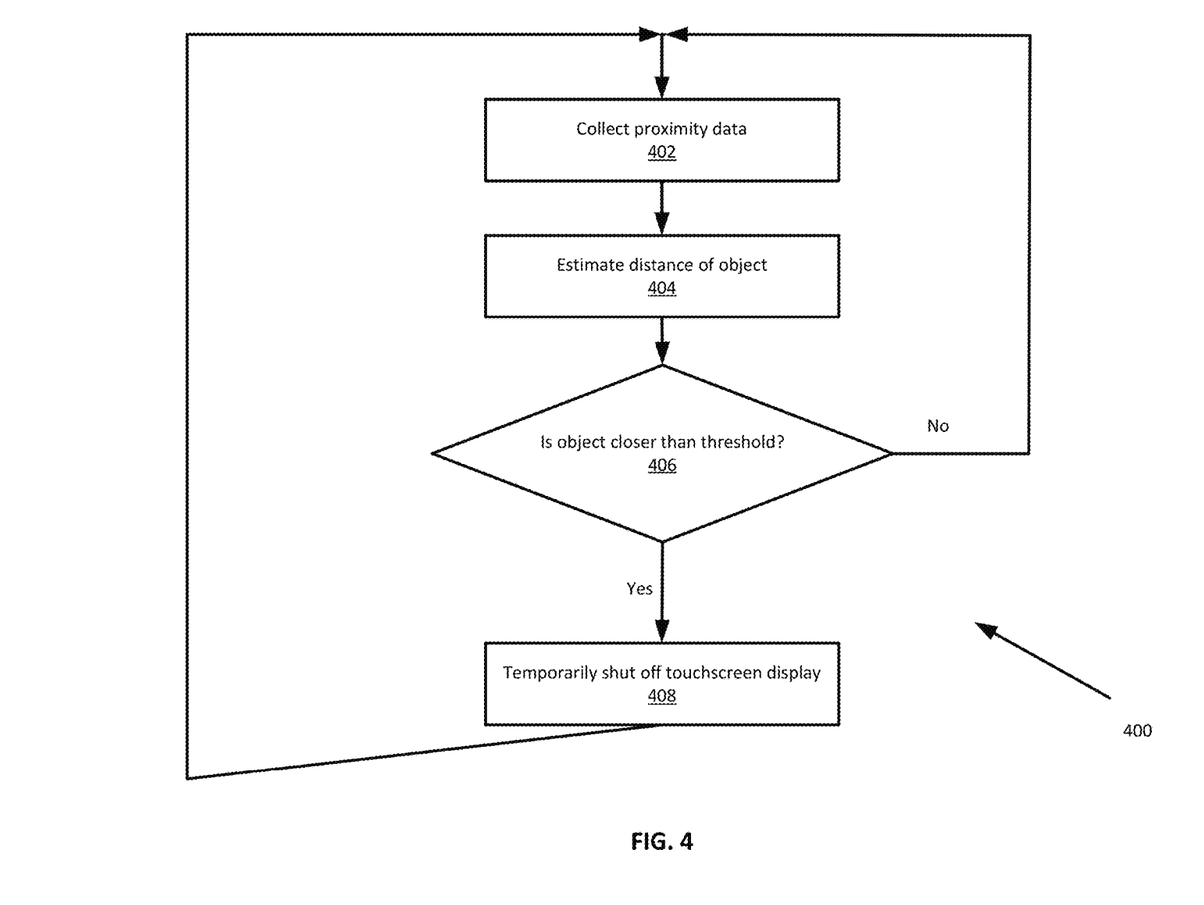
FIG. 4 is a flowchart illustrating a method of deactivating a touchscreen display when an object is closer to the electronic device than a predetermined threshold distance.

FIG. 4 is a flowchart illustrating at 400 an exemplary method of using proximity sensor data to manage accidental input on the touchscreen display 304. The proximity sensor 251 is associated with an infrared light emitter that emits infrared light at specific times, on instruction (e.g. from the processor 238) or periodically. The reflection of the emitted infrared light is picked up and measured by the proximity sensor 251. For example the proximity sensor 251 has or is associated with an infrared light sensor that can receive infrared light and determine the received light's intensity.

At 402, data is collected using the proximity sensor 251 at the electronic device 102. The collected data can include the intensity of the infrared light received at the proximity sensor 251. The received infrared light can result from infrared light emanating from the proximity sensor 251 (or infrared light emitter) and reflecting off of one or more objects proximal the proximity sensor 251. In a further example, the collected data can include the elapsed time before detection of reflection or a measurement of the intensity of reflected light, for example. For example, the elapsed time can be a measurement of the amount of time that has lapsed between the emission of the infrared light from the proximity sensor 251 (or the associated infrared light emitter) and the reception of the reflected infrared light at the proximity sensor 251. The processor 238 can store the data collected by the proximity sensor 251 in memory 224.

At 404 the distance of the object is estimated using the data collected by the proximity sensor 251. For example, the processor can use the measured intensity of infrared light received at the proximity sensor to estimate or calculate a distance that the objects is from the first face 302. By way of further example, the collected data may indicate the amount of time elapsed between the emission of the infrared signal or light and the reception of the reflected infrared light. An estimation of the distance that the object is from the first face 302 of the electronic device 102 can be calculated using this amount of elapsed time. It is understood that the proximity sensor 251 can operate using other processes for measuring the proximity of the object based on the emission or reception of infrared light.

At 406 the calculated distance of the object is compared to a threshold level. For example, the threshold can be a numerical value stored in memory 244 of the electronic device 102 and the processor 238 can compare the threshold to the calculated distance. If the calculated distance is smaller than the threshold level, the object is considered to be closer to the first face 302 of the electronic device 102 than the threshold level.

If the calculated distance of the object is closer to the first face 302 than the threshold level, then the touchscreen display is temporarily shut off (at 408). In accordance with one or more embodiments, only the touchscreen or input feature of the touchscreen display is deactivated while the output of the touchscreen display remains operational. The method may then proceed to collect proximity data again (at 402). For example, the electronic device 102 may wait a predetermined amount of time before proceeding to collect proximity data.

If the calculated distance of the object is not closer than the threshold distance (i.e. the calculated distance value is greater than the threshold level), then the method proceeds to collect proximity data again (at 402) without shutting off or deactivating the touchscreen. For example, the electronic device 102 may wait a predetermined amount of time before proceeding to collect proximity data.

In accordance with an embodiment, the threshold level is a value that is dependent on a baseline value associated with a state in which it is estimated that no object is proximate to the first face 302. For example, each of the threshold level and baseline value can be stored in memory 224 on the electronic device 102 and can represent distances (e.g. distances from the first face 302). The threshold level can be an offset above or below the baseline value.

An initial baseline can be set in the electronic device 102 during its manufacture. For example, the initial baseline value can be stored into memory 224 during the manufacturing process.

The baseline can be calculated or updated using data retrieved by the proximity sensor 251. For example, the proximity sensor 251 can measure the signal of any reflected infrared light when no object is proximal the first face 302 of the electronic device 102, which can in turn be used to calculate the baseline value.

The baseline can be calculated, reset or re-established periodically. For example, after a predetermined amount of time has elapsed since the previous baseline calculation, proximity data is collected and a new baseline value is calculated.

One or more environmental factors can alter the measured proximity data and thus the baseline value. For example, proximity data (and hence the calculated baseline value) can vary depending on the temperature of the electronic device 102, the ambient light conditions in and around the electronic device 102 and/or the battery voltage.

Exemplary Method for Estimating a Baseline

Figure 5:
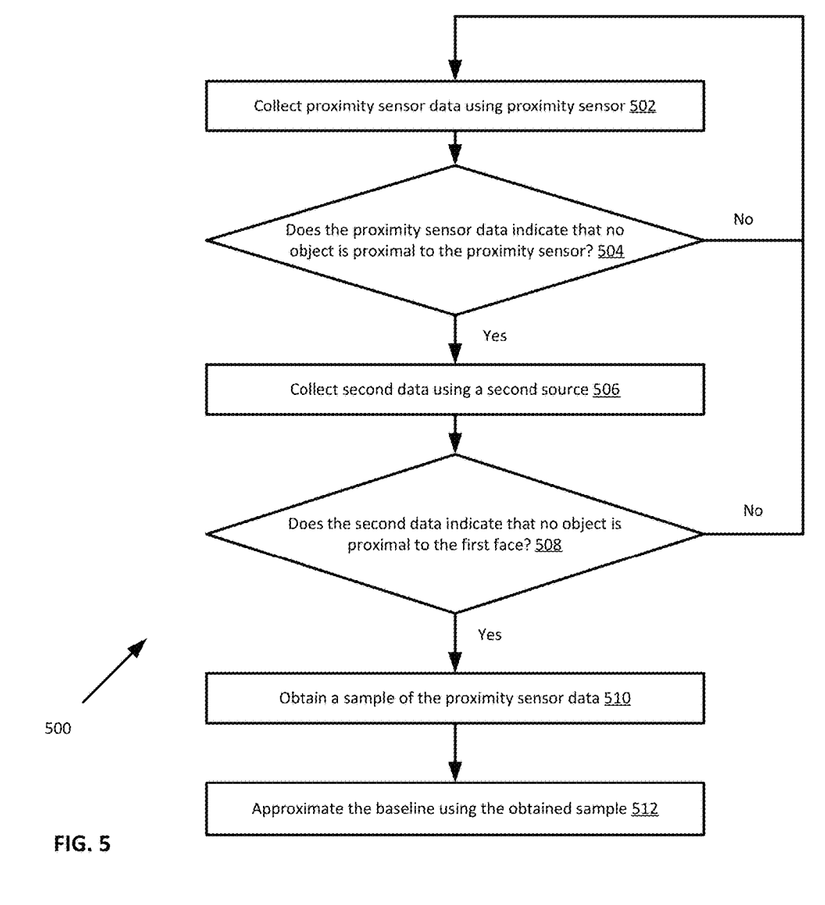
FIG. 5 is a flowchart illustrating a method of estimating a baseline of a proximity sensor on an electronic device.

FIG. 5 depicts an exemplary method 500 of estimating a baseline of a proximity sensor 251 on an electronic device 102.

At 502, the proximity sensor data is collected at the electronic device 102 using the proximity sensor 251. For example, infrared light is emitted from the electronic device 102 and the reflections of the infrared light (off of an object, for example) are measured at the proximity sensor 251. In accordance with an exemplary embodiment, the time that elapses between the infrared emission and the receipt of the reflection is measured and stored in memory 224. In accordance with an exemplary embodiment, the proximity sensor 251 can measure the intensity of the infrared light reflection received at the electronic device 102 and, using this measured intensity, can estimate the proximity of an object to the first face 302. In other words, the proximity sensor data may be the intensity of infrared light received at the proximity sensor 251.

At 504, a determination is made as to whether the proximity sensor data indicates that no object is proximal to the proximity sensor 251. For example, the proximity sensor 251 can detect the proximity of objects to the first face 302 of the electronic device 102. In an exemplary embodiment, the processor 238 uses the threshold level stored in memory 224 on the electronic device 102 in order to evaluate whether an object is proximal to the first face 302 by determining whether the data gathered by the proximity sensor 251 indicates that an object is closer to the first face 302 than the threshold level. In a further example, the processor 238 may use a threshold level in order to evaluate whether an object is proximal to the first face 302 by determining that the measured intensity of the infrared light received at the proximity sensor 251 (e.g. the reflection amplitude) is higher than the threshold level.

By way of further example, the data collected at the proximity sensor 251 can be used to calculate a distance measurement of the distance away from the proximity sensor 251 that an object is located. The calculation can be based on proximity sensor data including reflected infrared light received at the electronic device 102. In one or more embodiments, the processor 238 can take the raw infrared light reflection data (e.g. the intensity or the time since the infrared light or signal was sent from the electronic device 102) as input and use it to calculate an estimated distance of the object away from the proximity sensor 251 (e.g. on the first face 302). Such calculations can be performed using an existing baseline value which can normalize the proximity sensor data readings. By way of further example, the threshold level(s) can be an offset from the baseline value or baseline measurement. The existing baseline value can be stored in memory 224. In one or more further embodiments, the proximity sensor data is not used to calculate a distance of an object from the proximity sensor 251 but is instead used to measure the intensity of infrared light reflected off of the object. For example, if the measured intensity is less than a threshold level then it is determined that there is no object proximal to the first face 302.

The proximity sensor 251 may be directed out of the first face 302 as shown in FIG. 3. In other words, the infrared light may be emanating from the first face 302 in order to reflect off of objects within a distance of X from the first face 302 of the electronic device 102. In one or more other embodiments, there may be one or more proximity sensors 251 at one or more other locations on the electronic device 102. In accordance with an exemplary embodiment, the first face 302 is the face of the electronic device 102 on which the display 206 is located. Similarly, the first face 302 is where the microphone and/or speaker can be located. Therefore, when the electronic device 102 is being used as a phone, the first face 302 is proximal to the person who is talking on the phone. Similarly, when the electronic device 102 is being used as a phone the proximity sensor 251 is configured to detect that a person is proximal to the first face 302 of the electronic device 102.

If it is determined that an object is possibly or likely proximal to the first face 302 (or the proximity sensor 251) based on the proximity sensor data, then the proximity sensor data is again collected using the proximity sensor 251 at 502. There may be a time lag before proximity sensor data is again collected.

If it is determined that no object is likely proximal to the first face 302 based on the proximity sensor data, second data is collected using a second source at the electronic device 102 at 506. The second source can be attached to the electronic device 102 or can be in communication with the electronic device 102. The second data can be received by the second source and stored in the memory 224 of the electronic device 102 for example.

In accordance with an exemplary embodiment, collecting second data using a second source at the electronic device 102 can include determining the orientation of the electronic device 102 using the orientation sensor 280. In other words, the second source can be the orientation sensor 280 and the second data can be the orientation of the electronic device 102. For example, the orientation of the electronic device 102 can include the angle of the electronic device 102 relative to the ground, as measured by the orientation sensor 280. By way of further example, the orientation of the electronic device 102 can include the acceleration of the electronic device 102 relative to the ground, as measured by the orientation sensor 280.

In accordance with an exemplary embodiment, collecting second data using a second source at the electronic device 102 includes evaluating whether one of the proximity sensor data or the proximity sensor 251 are being accessed by a component associated with the electronic device 102. A component can include an application or process running or executing on the electronic device 102 or an application that is accessing the proximity sensor data or proximity sensor 251 from a remote location (e.g. through a network). By way of example, the operating system may be accessing proximity sensor data to determine whether a finger is covering optical apertures associated with the light sensor and proximity sensor when the electronic device 102 is being held. The evaluation can be performed by the processor 238. For example, the processor 238 can determine whether data obtained by the proximity sensor 251 is being processed on behalf of or used by an application operating on the electronic device 102. By way of further example, the processor 238 can determine that the proximity sensor 251 is in use by one or more applications or processes.

In accordance with an exemplary embodiment, collecting second data using a second source at the electronic device 102 includes collecting ambient light readings using a light sensor at the electronic device 102. The light sensor may be located at the first face 302 of the electronic device 102, for example. The light sensor can measure the amount, or intensity, of the light that it receives (e.g. at the first face 302 where it may be located). The measurements taken by the light sensor can be stored in memory 224 on the electronic device 102. In one or more embodiments, the proximity sensor 251 may also operate as the ambient light sensor 275 (or as a light sensor).

It is understood that collecting second data using a second source at the electronic device 102 can include collecting second data from multiple second sources. It is understood that there are other second sources that the electronic device 102 can use to collect data, such as other input output components and other sensors.

At 508 a determination is made as to whether the second data indicates that no object is proximal to the first face 302. For example, the second data collected by the second source can be compared to reference data stored in memory 224. The reference data can be previously collected data that is consistent with a state of the electronic device 102 in which no object is proximal to the first face 302. By way of further example, one or more runtime heuristics can be used in association with the second data to determine or estimate that no object is proximal the first face 302. The runtime heuristics can be a combination of second data from one or more second sources.

In accordance with an exemplary embodiment, determining whether no object is proximal to the first face 302 of the electronic device 102 based on the second data includes determining whether the orientation of the electronic device 102 is within a predetermined range of orientations. For example, the memory 224 associated with the electronic device 102 can store predefined orientation data including a range of orientations of the electronic device 102 that are consistent with a state of the electronic device 102 in which there is no object proximal to the first face 302. By way of further example, the electronic device 102 can access orientation data including a range of orientations from a remote source (e.g. across a communications network 106). After the orientation sensor 280 has measured the orientation of the electronic device 102, the measurement is compared (e.g. by operation of the processor 238) to the range of stored orientations. If the measurement of the orientation is within the predetermined range of orientations, then the electronic device 102 is considered to be in use whereby an object is potentially proximal the first face 302 of the electronic device 102.

In accordance with an exemplary embodiment, determining whether no object is proximal to the first face 302 of the electronic device 102 based on the second data includes determining whether any components associated with the electronic device 102 are accessing one of the proximity sensor data or the proximity sensor 251. For example, after the processor 238 has evaluated that no applications are accessing the proximity sensor 251 or the proximity sensor data, either from the electronic device 102 or remotely, it determines that no object is likely proximal to the first face 302.

In accordance with an exemplary embodiment, determining whether no object is proximal to the first face 302 of the electronic device 102 based on the second data includes determining whether the ambient light readings are consistent with predetermined conditions indicating that an object is (or is not) proximal to the first face 302. Predetermined conditions can be stored in memory 224. For example, the predetermined conditions may have been set or stored in memory when the electronic device 102 was manufactured. By way of further example, the predetermined conditions can be entered or stored into memory 224 through one or more input interfaces or input devices. The predetermined conditions can include one or more of light intensity or temperature values, for example. The predetermined conditions can be a range of settings or a range of conditions. For example, the predetermined conditions can be a range of ambient light readings (e.g. a range of light intensity or a range of temperatures) consistent with the electronic device 102 not being in use. The ambient light readings can be measurements gathered at the ambient light sensor 275. For example, the ambient light readings can be light intensity measurements. It is understood that the ambient light sensor 275 is an example of a light sensor that can be used to measure ambient light (or other light).

The processor 238 can compare the ambient light readings with the predetermined conditions stored in memory 224. If the ambient light readings are consistent with one or more predetermined conditions the processor 238 determines that an object is not proximal to the first face 302 of the electronic device 102. The predetermined conditions are consistent with the conditions that exist when the electronic device is not in use.

The ambient light readings can be measured or taken periodically at predetermined time intervals or can be triggered by an event. For example, the ambient light readings can be measured when the electronic device 102 is moved from an at-rest state.

It is understood that the described methods could operate such that the predetermined conditions are consistent with the conditions that exist when the electronic device 102 is in use. In such embodiments, when the second data is consistent with the predetermined conditions the processor 238 determines that no object is proximal to the first face 302.

If it is determined that an object is possibly or likely proximal to the first face 302, the proximity sensor data is collected again using the proximity sensor 251 at 502. It is understood that there may be a time lag before collecting proximity sensor data again.

If it is determined that no object is likely proximal to the first face 302, a sample of the proximity sensor data is obtained at the electronic device 102 at 510. Obtaining a sample of the proximity sensor data at the electronic device 102 is performed when it is determined that no object is likely to be proximal to the first face 302 of the electronic device 102. For example, the determination that no object is proximal to the first face 302 of the electronic device 102 can be based on the proximity sensor data and based on the second data. In accordance with an exemplary embodiment, the sample of proximity sensor data is obtained by gathering at least one burst of a predetermined number of proximity sensor readings and a predetermined number of ambient light readings and validating the proximity sensor readings based on the ambient light readings. For example, during each burst of the predetermined number of proximity sensor readings, the ambient light sensor 275 also measures the ambient light.

In accordance with another embodiment, obtaining a sample of the proximity sensor data at 510 at the electronic device 102 further includes obtaining a predetermined number of valid bursts of proximity sensor readings and obtaining a predetermined number of ambient light readings, and wherein approximating the baseline using the obtained samples includes calculating an estimate of the baseline based on the proximity sensor readings and the ambient light readings.

In one or more embodiments, the obtaining a sample of the proximity sensor data at 510 at the electronic device 102 is only performed if it the display is turned on or illuminated (e.g. by a backlight).

At 512, the baseline of the proximity sensor 251 is approximated using the obtained sample. In accordance with one or more exemplary embodiments, approximating the baseline of the proximity sensor using the obtained sample includes averaging weighted samples of the bursts of proximity sensor readings. It is understood that the proximity sensor readings could first be validated such as by using concurrent ambient light readings. By way of further example, the samples of the valid bursts of proximity sensor readings are weighted based on the ambient light readings. For example, the valid bursts of proximity sensor readings can be weighted using the concurrent ambient light reading for each burst.

It is understood that collecting second data at 506, determining whether no object is proximal based on the second data at 508 and obtaining a sample of the proximity sensor data 510 can be performed simultaneously. For example, the proximity sensor 251 can include the ambient light sensor, and when the second data is the ambient light readings then the second data may be collected at the same time that the samples of the proximity sensor data 510 are obtained and that the determination at 508 based on the second data is made. By way of further example the determination of whether the proximity sensor data indicates that no object is proximal to the proximity sensor 251 at 504 and the determination of whether the second data indicates that no object is proximal to the first face 302 at 508 can be performed simultaneously in or the opposite order as described above. For example, the second data can be collected before the proximity sensor data is collected such that the proximity sensor data will be collected after it is determined that no object is proximal to the first face 302 based on the second data and such that the sample of the proximity sensor data will be obtained after it is determined that the proximity sensor data indicates that no object is proximal to the proximity sensor 251.

Exemplary Method for Approximating the Baseline

Figure 6:
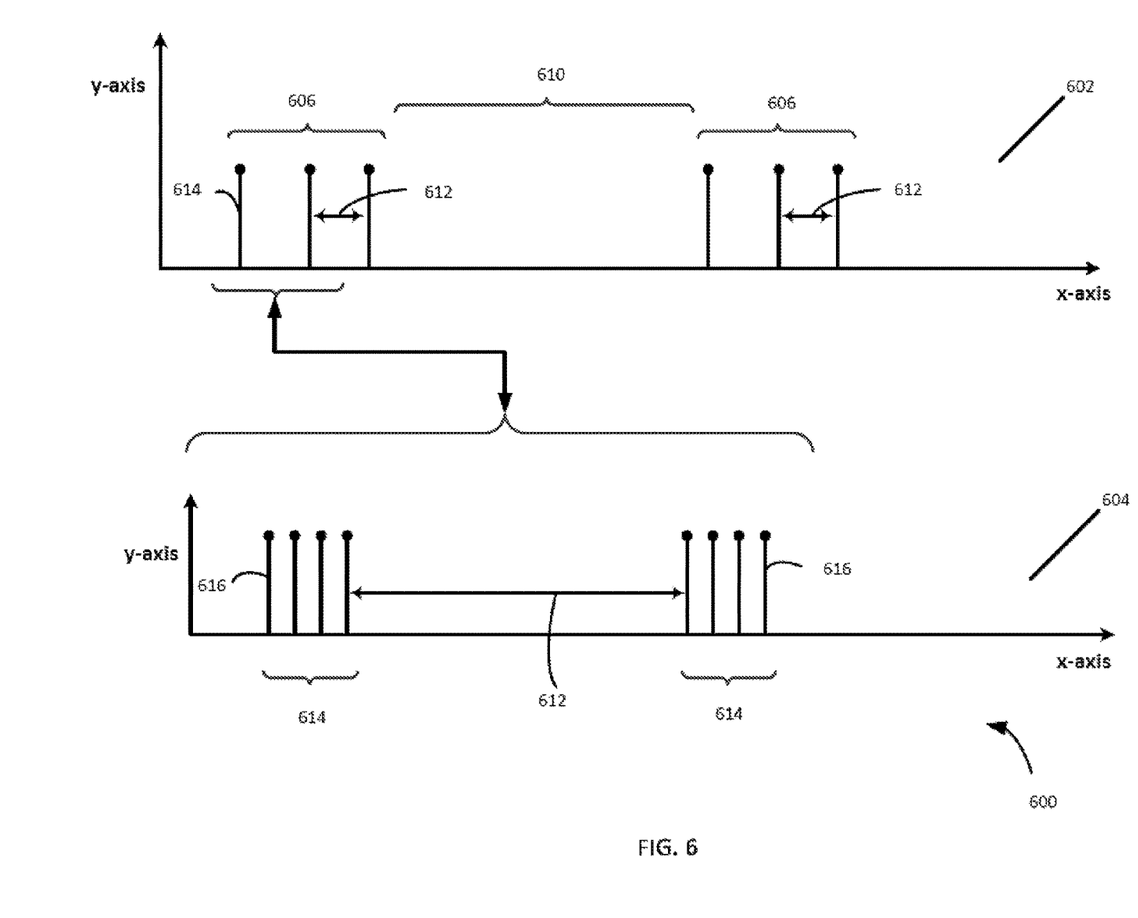
FIG. 6 is a block diagram illustrating an exemplary method for approximating a baseline of a proximity sensor on an electronic device.

With reference to FIG. 6 an exemplary method for obtaining a sample of the proximity sensor data at 510 and of approximating the baseline at 512 in accordance with one or more embodiment is depicted at 600.

A timeline 602 is illustrated with two proximity sensor baseline estimation sampling periods 606 and an at-rest time period 610 in between. During each sampling period 606 a set of proximity sensor data bursts 614 are gathered. The proximity sensor data bursts 614 in a sampling period 606 can be separated by a predetermined length of time or inter-burst delay 612. The at-rest time period 610 can be the time period during which it is determined that an object is proximal to the electronic device 102. For example, during the at-rest time period 610 either the proximity sensor data or the second data may indicate that an object is likely proximal to the electronic device 102.

A timeline 604 shows two sequential data bursts 614 in more detail separated by an inter-burst delay 612. Each data burst 614 is made up of four proximity samples 616. Each proximity sample 616 can be an infrared light emission and reflection reading for example. The vertical height of the proximity samples 616 may represent the intensity of each proximity sample 616 received at the proximity sensor 251. For example, the height of the proximity samples can be the intensity of the light measured at the proximity sensor 251 during and/or after an infrared light is emitted from the proximity sensor 251. The measured intensity level can be from emitted infrared light that is reflected off of nearby objects, for example. It is understood that there can be fewer or more than four proximity samples 616 in each data burst 614. The inter-burst delay 612 can be a predetermined length of time. For example, the length of the inter-burst delay 612 can be preprogrammed into memory 224 during manufacture of the electronic device 102 or it can be input through an input interface during use of the electronic device 102. In certain embodiments, the inter-burst delay 612 can vary based on the second data. For example, certain second data (such as certain ambient light readings) may be associated in memory 224 with a certain (e.g. predefined) inter-burst delay 612.

The number of data bursts 614 in a set of data bursts can be predefined and/or can depend on the number of valid proximity sensor readings 616 that are obtained within the sampling period 606. Alternatively, the sampling period 606 can depend on the number of obtained data bursts 614. For example, there can be three data bursts 614 in each sampling period 606 with each data burst containing four valid proximity sensor readings 616. Each valid proximity sensor reading 616 can be a value such as a light intensity value or a time value associated with the time elapsed between the light emission and the receipt of the reflected light. In the illustrated embodiment, the intensity level of the proximity sensor readings 616 (e.g. the intensity level measured at the proximity sensor 251 after or during the emission of infrared light) and of the data bursts 614 is shown on the y-axis. The intensity of the data bursts 614 can be the average intensity of the proximity sensor readings 616 obtained during the sampling period 606 or can be the average of the valid samples 616 obtained during the time period 606, for example. In one or more embodiments, certain conditions are used to validate the proximity sensor readings 616 or readings, such as absolute value of the light intensity measurements of the samples 616 and the difference between the maximum and minimum of the proximity sensor readings 616 within a single data burst 614. For example, there may be a predetermined threshold value that the conditions are compared to (so as to exclude proximity sensor readings 616 taken under certain conditions that fall within the threshold value, for example) or there may be dynamic heuristics used to exclude proximity sensor readings 616 taken under certain conditions. In one or more embodiments, ambient light readings can be measured simultaneously with each proximity sensor reading 616 or with each proximity sensor data burst 614. The difference between the maximum and minimum of the ambient light samples within a single proximity sensor data burst 614 can be used to validate the proximity sensor readings 616.

In accordance with one or more embodiments, the set of data bursts 614 including the proximity sensor readings 616 obtained during a sampling period 606 are the samples obtained of the proximity sensor data identified at 510 in FIG. 5. Approximating the baseline at 512 using the obtained samples can be a calculation or a separate method that can be carried out (e.g. by the processor 238) using the samples obtained during the most recent sampling period 606. In one or more embodiments, approximating the baseline at 512 using the obtained samples can be a calculation or separate method that is carried out using the samples obtained during all of the data bursts 614 that occurred since the time that the previous approximation of the baseline was calculated. Approximating the baseline can be a calculation that is carried out during the at-rest time period 610 or shortly after the sampling period 606. The timing of the calculation of the approximation of the baseline can be any suitable value. The approximation 512 can be calculated using the whole set of proximity sensor readings 616 during the sampling period 606. In a further example, the approximation calculation 512 may be performed on proximity sensor readings 616 in one or more sampling periods 606. In a further example, one or more computing metrics can be performed on a data burst 614 to reduce or represent the proximity sensor readings 616 in the data burst 614 as one or more values that can then be used in the approximation calculation 512. In such an example, the approximation 512 can be performed on the one or more value provided in one or more data bursts 614. Thus the data that can be used to perform the approximation calculation can include one or more data bursts 614, or one or more proximity sensor readings 616

In accordance with one or more exemplary embodiments, after a number, M, of data bursts 614 have completed, an approximation method is run or executed by the processor 238 to estimate the baseline of the proximity sensor 251 based on the M data bursts 614.

In accordance with one or more embodiments, a pre-defined number of data bursts 614 are taken with a pre-defined at-rest time period 612 between each data burst 614 when obtaining a sample of the proximity sensor data at 510. Alternatively, there is one data burst 614 taken with a predefined number of proximity sensor readings 616 when obtaining a sample of the proximity sensor data at 510. In the latter embodiment(s), the at-rest time period 610 can be a period when either the proximity sensor 251 or the second source provides data indicating that there is an object proximal to the first face 302. The at-rest time period 610 can also be a period when the proximity sensor 251 is in use by another application or component, for example.

Each proximity sensor data burst 614 has a proximity metric, $p_B$, derived from the maximum value in a burst, B. It is understood that other forms of minimum, maximum, average or other filters on the proximity sensor data from a burst B could yield a suitable metric $p_B$. It is also understood that other types of filters that reduce the risk of underestimating the value of the baseline can be used. In the illustrated embodiment, the proximity metric is a measurement of the intensity of infrared light or infrared signal measured at the proximity sensor 251.

A weighting function, W(p,L), derives a weight for the proximity metric, $p_B$, based on an ambient light metric, $L_B$. The ambient light metric, $L_B$, can be based on average light intensity measured by the ambient light sensor 275 during the sampling of the data burst 614 by the proximity sensor 251. It is understood that some ambient light conditions are more likely to be present in states when the electronic device 102 is idle or when it is determined that no object is proximal the first face 302. The weighting function can be tuned to compensate for effects of ambient light on proximity sensor readings. For example, an effect is that ambient light conditions can bias the value of the proximity sensor readings 616. It is understood that the proximity sensor 251 can gather ambient light readings (i.e. light readings not from reflected infrared light) simultaneously or concurrently with the proximity sensor 251 readings or data bursts 614. In one or more embodiments, an ambient light sensor 275 can be used to gather the ambient light readings.

Each of the proximity metric, $p_B$, the weighting function, W(p,L), and any other parameters or values used in the approximation method can be stored in memory 224.

In accordance with one or more embodiments, the baseline estimate for a set of M bursts can be determined by the following equation:

$$\text{Baseline} = \frac{\sum_{k=1}^{M} p_{B_k} W(p_{B_k}, L_{B_k})}{\sum_{k=1}^{M} W(p_{B_k}, L_{B_k})}$$

In an exemplary embodiment there are 3 valid data samples 616 in each data burst 614; there are 15 data bursts 614 used when obtaining a sample of the proximity sensor data 510; and the inter-burst period 612 lasts for 3 seconds. In a further embodiment, the inter-burst period 612 lasts for 60 seconds. In a further embodiment, the weighting function is as follows:

W(p,L), where L is in Lux:

0.7 for 50<=L<150

1.0 for 150<=L<400

0.5 for 400<=L 1000

L is an ambient light metric representing the ambient light intensity that shone on the electronic device 102 (or on the first face 302) when a data burst 614 was taken. In one or more embodiments, L is the average illuminance, measured in Lux taken during a data burst 614.

It is understood that the method may pause during times when the second data source indicates that there is an object proximal the first face 302 or that conditions are not compatible with an electronic device 102 at rest, thus increasing the inter-burst time period 612.

While the present application is primarily described in terms of methods, a person of ordinary skill in the art will understand that the present application is also directed to various apparatus' such as electronic devices 102 including a mobile communications device. The electronic device 102 includes components for performing at least some of the aspects and features of the described methods, which may be by way of hardware components (such as the memory 224 and/or the processor 238), software or any combination of the two, or in any other manner. Moreover, an article of manufacture for use with the apparatus, such as a pre-recorded storage device or other similar computer readable storage medium including program instructions recorded thereon, or a computer data signal carrying computer readable program instructions may direct an apparatus to facilitate the practice of the described methods. For example, a compute readable storage medium may include computer executable instructions for performing one or more of the methods described herein. It is understood that such apparatus and articles of manufacture also come within the scope of the present application.

The term "computer readable medium" or "computer readable storage medium" as used herein means any medium which can store instructions for use by or execution by a computer or other computing device including but not limited to, a portable computer diskette, a hard disk drive (HDD), a random access memory (RAM), a read-only memory (ROM), an erasable programmable-read-only memory (EPROM) or flash memory, an optical disc such as a Compact Disc (CD), Digital Versatile Disc (DVD) or Blu-Ray™ Disc, and a solid state storage device (e.g., NAND flash or synchronous dynamic RAM (SDRAM)).

One or more embodiments have been described by way of example. It will be apparent to persons skilled in the art that a number of variations and modifications can be made without departing from the scope of what is defined in the claims.

What is claimed is the following:

1. A method of enhancing accuracy of outputs of a proximity sensor on an electronic device, the method comprising:
   generating proximity sensor data at the electronic device using the proximity sensor;

determining a current value of an angle of the electronic device relative to the ground using an orientation sensor;

comparing the current value of the angle with a predefined range of angles that is consistent with a state of the electronic device in which there is no object proximal to a first face of the electronic device;

determining that no object is proximal to the first face of the electronic device based on both the generated proximity sensor data and the comparison of the current value of the angle of the electronic device with the predefined range of angles;

in response to determining that no object is proximal to the first face of the electronic device, setting the proximity sensor to obtain a sample of proximity sensor data at the electronic device by gathering at least one burst of a predetermined number of proximity sensor readings;

obtaining an estimate of the current baseline of the proximity sensor using the obtained sample, and resetting the baseline of the proximity sensor based on the estimate of the current baseline.

2. The method of claim 1, wherein determining that no object is proximal to the first face of the electronic device based on the proximity sensor data comprises determining that the proximity sensor data is below a predetermined threshold.

3. The method of claim 1, wherein determining that no object is proximal to the first face of the electronic device comprises evaluating whether one of the proximity sensor data or the proximity sensor are being accessed by a component associated with the electronic device.

4. The method of claim 3, wherein determining that no object is proximal to the first face of the electronic device comprises determining that no components associated with the electronic device are accessing one of the proximity sensor data or the proximity sensor.

5. The method of claim 1, wherein determining that no object is proximal to the first face of the electronic device comprises collecting ambient light readings using a light sensor at the electronic device.

6. The method of claim 5, wherein determining that no object is proximal to the first face of the electronic device further comprises determining that the ambient light readings are consistent with predetermined conditions indicating that an object is not proximal to the first face of the electronic device.

7. The method of claim 1, wherein obtaining the sample of the proximity sensor data further comprises gathering a predetermined number of ambient light readings and wherein the proximity sensor readings are validated based on the ambient light readings.

8. The method of claim 1, wherein obtaining a sample of the proximity sensor data at the electronic device further comprises obtaining a predetermined number of valid bursts of proximity sensor readings and obtaining corresponding ambient light readings, and wherein obtaining an estimate of the current baseline of the proximity sensor using the obtained sample comprises calculating an estimate of the baseline based on the proximity sensor readings and the ambient light readings.

9. The method of claim 8, wherein obtaining an estimate of the current baseline of the proximity sensor using the obtained sample comprises averaging weighted proximity sensor readings.

10. The method of claim 9, wherein the samples of the valid bursts of proximity sensor readings are weighted based on the ambient light readings.

11. The method of claim 8, further comprising deriving, for each of the predetermined number of valid bursts of proximity sensor readings, a proximity metric, $P_B$, and a weight value for the proximity metric based on an ambient light metric, $L_B$.

12. The method of claim 11, wherein the estimate of the current baseline is obtained based on a set of M valid bursts of proximity sensor readings by computing $$\frac{\sum_{k=1}^{M} p_{B_k} W(p_{B_k}, L_{B_k})}{\sum_{k=1}^{M} W(p_{B_k}, L_{B_k})},$$

wherein function $W(p_B, L)$ represents a weighting function which assigns a weight for the proximity metric, $p_B$.

13. The method of claim 1, wherein generating proximity sensor data at the electronic device using the proximity sensor comprises measuring, at the electronic device, a reflection of an infrared light beam emanating from the electronic device.

14. The method of claim 1, wherein the proximity sensor data comprises the intensity of infrared light measured at the proximity sensor.

15. The method of claim 1, further comprising:

determining a current value of an acceleration of the electronic device relative to the ground using an orientation sensor; and comparing the current value of the acceleration with a predefined range of accelerations that is consistent with a state of the electronic device in which there is no object proximal to a first face of the electronic device, wherein determining that no object is proximal to the first face of the electronic device is based also on comparison of the current value of the acceleration of the electronic device with the predefined range of accelerations.

16. An electronic device comprising:

a memory;

a proximity sensor for generating proximity sensor data;

an orientation sensor; and a processor coupled to the memory, the proximity sensor, and the orientation sensor, the processor to execute instructions to configure the processor to:

generate proximity sensor data at the electronic device using the proximity sensor;

determine a current value of an angle of the electronic device relative to the ground using an orientation sensor;

compare the current value of the angle with a predefined range of angles that is consistent with a state of the electronic device in which there is no object proximal to a first face of the electronic device;

determine that no object is proximal to a first face of the electronic device based on both the generated proximity sensor data and the comparison of the current value of the angle of the electronic device with the predefined range of angles;

in response to determining that no object is proximal to the first face of the electronic device, set the proximity sensor to obtain a sample of proximity sensor data at the electronic device by gathering at least one burst of a predetermined number of proximity sensor readings and validating the proximity sensor readings of the at least one burst;

obtain an estimate of a current baseline of the proximity sensor using the obtained sample, and reset the baseline of the proximity sensor based on the estimate of the current baseline.

17. The electronic device of claim 16, wherein determining that no object is proximal to the first face of the electronic device comprises collecting ambient light readings using a light sensor at the electronic device and determining that the ambient light readings are consistent with predetermined conditions indicating that an object is not proximal to the first face of the electronic device.

18. The electronic device of claim 16, wherein the processor is further configured to:

determine a current value of an acceleration of the electronic device relative to the ground using an orientation sensor; and compare the current value of the acceleration with a predefined range of acceleration that is consistent with a state of the electronic device in which there is no object proximal to a first face of the electronic device, wherein determining that no object is proximal to the first face of the electronic device is based also on comparison of the current value of the acceleration of the electronic device with the predefined range of accelerations.

19. A non-transitory computer readable storage medium comprising computer-executable instructions which, when executed, cause a processor to:

generate proximity sensor data at an electronic device using a proximity sensor;

determine a current value of an angle of the electronic device relative to the ground using an orientation sensor;

compare the current value of the angle with a predefined range of angles that is consistent with a state of the electronic device in which there is no object proximal to a first face of the electronic device;

determine that no object is proximal to a first face of the electronic device based on both the generated proximity sensor data and the comparison of the current value of the angle of the electronic device with the predefined range of angles;

in response to determining that no object is proximal to the first face of the electronic device, set the proximity sensor to obtain a sample of proximity sensor data at the electronic device by gathering at least one burst of a predetermined number of proximity sensor readings and validating the proximity sensor readings of the at least one burst;

obtain an estimate of a current baseline of the proximity sensor using the obtained sample, and reset a baseline of the proximity sensor based on the estimate of the current baseline.

* * * * *